United States Patent
Ding et al.

(10) Patent No.: US 10,121,959 B1
(45) Date of Patent: Nov. 6, 2018

(54) FDSOI STT-MRAM DESIGN

(71) Applicant: GLOBALFOUNDRIES Singapore Pte. Ltd., Singapore (SG)

(72) Inventors: Yinjie Ding, Singapore (SG); Eng Huat Toh, Singapore (SG); Kangho Lee, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/625,272

(22) Filed: Jun. 16, 2017

(51) Int. Cl.
*G11C 11/16* (2006.01)
*H01L 43/02* (2006.01)
*H01L 27/22* (2006.01)
*H01L 43/08* (2006.01)
*H01L 43/12* (2006.01)

(52) U.S. Cl.
CPC ............ *H01L 43/02* (2013.01); *G11C 11/161* (2013.01); *G11C 11/1675* (2013.01); *H01L 27/228* (2013.01); *H01L 43/08* (2013.01); *H01L 43/12* (2013.01)

(58) Field of Classification Search
CPC ................................. G11C 11/16; G11C 11/15
USPC ................................................... 365/148, 158
See application file for complete search history.

(56) References Cited

U.S. PATENT DOCUMENTS

| 9,734,882 B2* | 8/2017 | Toh ........................ G11C 11/165 |
| 9,818,933 B2* | 11/2017 | Wang ....................... H01L 43/02 |
| 2010/0080036 A1* | 4/2010 | Liu .......................... G11C 11/16 365/145 |

* cited by examiner

*Primary Examiner* — Hoai V Ho
*Assistant Examiner* — Minh Dinh
(74) *Attorney, Agent, or Firm* — Ditthavong & Steiner, P.C.

(57) ABSTRACT

A method of forming a segmented FDSOI STT-MRAM using dummy WL blocks and the resulting device are provided. Embodiments include forming a plurality of FDSOI STT-MRAM active WL blocks laterally separated across a memory array; forming a FDSOI STT-MRAM dummy WL block parallel to and on opposite sides of each active WL block; forming a plurality of SL structures laterally separated across the memory array; forming a plurality of BL structures laterally separated across the memory array; and connecting the plurality of SL and BL structures to the plurality of active WL blocks.

17 Claims, 3 Drawing Sheets

FDSOI STT-MRAM DESIGN

TECHNICAL FIELD

The present disclosure relates to a memory bit cell design. The present disclosure is particularly applicable to a spin-transfer torque magnetoresistive random-access memory (STT-MRAM) formed on a fully depleted silicon-on-insulator (FDSOI).

BACKGROUND

High word line voltage (VWL) and a large cell size are typically required to deliver adequate write current ($I_{Write}$) with respect to known STT-MRAM on FDSOI designs. However, high VWL and a large cell size can cause time-dependent dielectric breakdown (TDDB) and macro size concerns, respectively. A known solution is to adopt forward body bias (FBB). However, simply adopting FBB can cause unselected cell leakage to increase by an order greater than one (1) and such leakage can affect write-ability (charge-pump) and read-ability ('1' and '0' differentiation).

A need therefore exists for methodology enabling formation of a FDSOI STT-MRAM that achieves adequate $I_{Write}$ with FBB and that minimizes unselected cell leakage current without requiring a large cell size and the resulting device.

SUMMARY

An aspect of the present disclosure is a process of forming a segmented FDSOI STT-MRAM using dummy word line (WL) blocks.

Another aspect of the present disclosure is a segmented FDSOI STT-MRAM with dummy WL blocks.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of active WL blocks laterally separated across a memory array; forming a FDSOI STT-MRAM dummy WL block parallel to and on opposite sides of each active WL block; forming a plurality of source line (SL) structures laterally separated across the memory array; forming a plurality of bit line (BL) structures laterally separated across the memory array; and connecting the plurality of SL and BL structures to the plurality of active WL blocks.

Aspects of the present disclosure include selecting one active WL block for a write function; applying FBB to the selected active WL block; and applying zero or reverse body bias (RBB) to all unselected active WL blocks. Further aspects include forming each active WL block by: forming a n-type well (NW); forming a n-type ground plane (GP-N) layer over the NW; forming a buried oxide (BOX) layer over the GP-N layer; forming a silicon (Si) layer over the BOX layer; forming two pairs of two gates laterally separated over the Si layer; forming a shallow trench isolation (STI) region through the Si, BOX, and GP-N layers and a portion of the NW on opposite sides of each pair of gates; forming a n-type lightly dope drain (nLDD) in the Si layer on opposite sides and under a portion of each gate; and forming a n-type raised source/drain (nRSD) over each nLDD adjacent to and on opposite sides of each gate. Another aspect includes forming each dummy WL block by: forming a p-type well (PW); forming a p-type ground plane (GP-P) layer over the PW; forming the BOX layer over the GP-P layer; forming the Si layer over the BOX layer; forming gates laterally separated over the Si layer; forming a STI region through the Si, BOX, and GP-P layers and a portion of the PW on opposite sides of the gates; forming a nLDD in the Si layer on opposite sides and under a portion of each gate; and forming a nRSD above each nLDD adjacent to and on opposite sides of each gate. Additional aspects include utilizing each gate of an active WL block as an active WL and each gate of a dummy WL block as a dummy WL. Other aspects include connecting a SL structure to the plurality of active WL blocks by: forming a SL contact over a nRSD between each pair of gates of each active WL block; and connecting the SL structure to the SL contacts. Further aspects include connecting a BL structure to the plurality of active WL blocks by: forming a metal/via stack or contact (CT) over each nRSD on opposite sides of each pair of gates of each active WL block; forming a landing pad over each CT; forming a magnetic tunneling junction (MTJ) stack over each landing pad; and connecting the BL structure to the MTJ stacks. Additional aspects include connecting a SL and a BL structure to the plurality of dummy WL blocks by: forming a SL contact over a nRSD between a pair of gates of each dummy WL block; forming a CT over each nRSD on opposite sides of a pair of gates of each dummy WL block; connecting the ST structure to the SL contacts; and connecting the BL structure to the MTJ stacks.

Another aspect of the present disclosure is a device including: a plurality of FDSOI STT-MRAM active WL blocks laterally separated across a memory array; a FDSOI STT-MRAM dummy WL block parallel to and on opposite sides of each active WL block; a plurality of SL structures laterally separated across the memory array; and a plurality of BL structures laterally separated across the memory array, wherein each SL and BL structure is connected to the plurality of active WL blocks.

Aspects of the device include one active WL block being selected for a write function allows an application of forward body bias FBB and all unselected active WL blocks allowing an application of zero or RBB. Further aspects include each active WL block having a NW; a GP-N layer over the NW; a BOX layer over the GP-N layer; a Si layer over the BOX layer; two pairs of two gates laterally separated over the Si layer; a STI region through the Si layer, BOX, and GP-N layers and a portion of the NW on opposite sides of each pair of gates; a nLDD in the Si layer on opposite sides and under a portion of each gate; and a nRSD over each nLDD adjacent to and on opposite sides of each gate. Additional aspects include each dummy WL block having a PW; a GP-P layer over the PW; the BOX layer over the GP-P layer; the Si layer over the BOX layer; gates laterally separated over the Si layer; a STI region through the Si, BOX, and GP-P layers and a portion of the PW on opposite sides of the gates; a nLDD in the Si layer on opposite sides and under a portion of each gate; and a nRSD above each nLDD adjacent to and on opposite sides of each gate. Another aspect includes each gate of an active WL block being utilized as an active WL and each gate of a dummy WL block is utilized as a dummy WL. Other aspects include the connection between a SL structure and the plurality of active blocks being a SL contact over each nRSD between each pair of gates of each active WL block. Further aspects include the connection between a BL structure and the plurality of active WL blocks being a CT over each nRSD on opposite sides of each pair of gates of each active WL block; a landing pad over each CT; and a MTJ stack over each landing pad. Additional aspects include the connection between a SL structure and the plurality of dummy WL blocks and the connection between a BL structure and the plurality of dummy blocks respectively being a SL contact over each nRSD between a pair of gates of each dummy WL block and a CT over each nRSD on opposite sides of a pair of gates of each dummy WL block. Another aspect includes the plurality of active and dummy WL blocks being a one transistor and one MTJ (1T1MTJ), a two transistors and one MTJ (2T1MTJ), a SL/BL, or a local SL cell structure.

A further aspect of the present disclosure is a method including: forming a plurality of FDSOI STT-MRAM active WL blocks laterally separated across a memory array; forming a FDSOI STT-MRAM dummy WL block parallel to and on opposite sides of each active WL block; forming a plurality of SL structures laterally separated across the memory array, perpendicular to the active and dummy WL blocks; forming a plurality of BL structures laterally separated across the memory array, parallel to the plurality of SL structures and perpendicular to the active and dummy WL blocks; connecting the plurality of SL and BL structures to the plurality of active and dummy WL blocks; selecting one active WL block for a write function; applying FBB to the selected active WL block; and applying zero or RBB to all unselected active WL blocks.

Aspects of the present disclosure include forming each active WL block by: forming a NW; forming a GP-N layer over the NW; forming a BOX layer over the GP-N layer; forming a Si layer over the BOX layer; forming two pairs of two gates laterally separated over the Si layer; forming a STI region through the Si layer, BOX, and GP-N layers and a portion of the NW on opposite sides of each pair of gates; forming a nLDD in the Si layer on opposite sides and under a portion of each gate; and forming a nRSD over each nLDD adjacent to and on opposite sides of each gate. Other aspects include forming each dummy WL block by: forming a PW; forming a GP-P layer over the PW; forming the BOX layer over the GP-P layer; forming the Si layer over the BOX layer; forming gates laterally separated over the Si layer; forming a STI region through the Si layer, BOX, and GP-P layers and a portion of the PW on opposite sides of the gates; forming a nLDD in the Si layer on opposite sides and under a portion of each gate; and forming a nRSD above each nLDD adjacent to and on opposite sides of each gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of large cell size and high VWL needed for adequate $I_{Write}$, unselected cell leakage, and compromised write-ability and read-ability attendant upon forming a FDSOI STT-MRAM. The problems are solved, inter alia, by forming a segmented FDSOI STT-MRAM with 2 dummy bitcells or blocks to separate the active WLs of the device into blocks.

Methodology in accordance with embodiments of the present disclosure includes forming a plurality of FDSOI STT-MRAM active WL blocks laterally separated across a memory array. A FDSOI STT-MRAM dummy WL block is formed parallel to and on opposite sides of each active WL block. A plurality of laterally separated SL structures are formed across the memory array. A plurality of laterally separated BL structures are formed across the memory array, and the plurality of SL and BL structures are connected to the plurality of active WL blocks.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
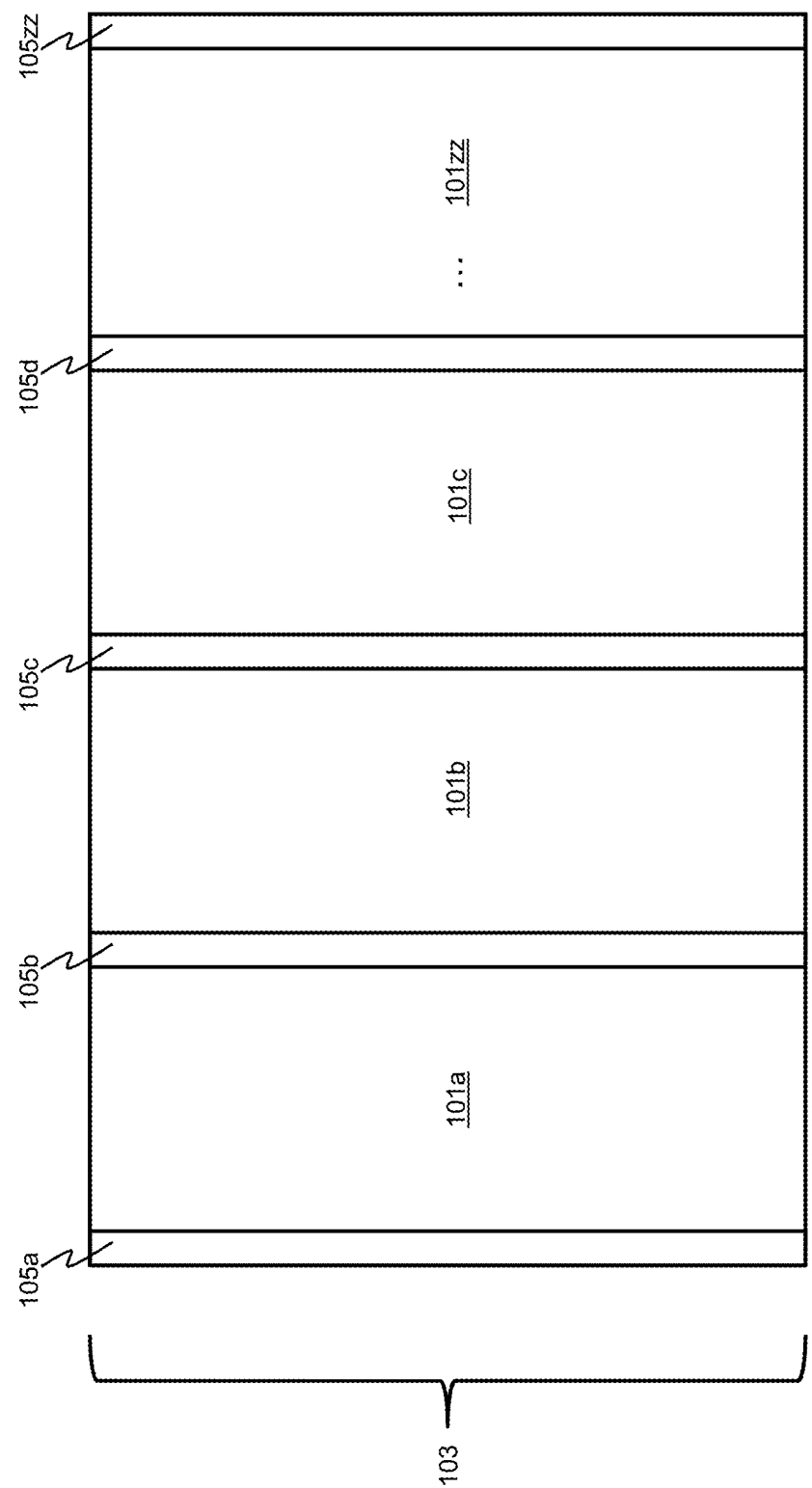
FIG. 1 schematically illustrates a FDSOI STT-MRAM segmentation design with dummy WL blocks, in accordance with an exemplary embodiment.

FIG. 1 schematically illustrates a FDSOI STT-MRAM segmentation design with dummy WL blocks, in accordance with an exemplary embodiment. Adverting to FIG. 1, laterally separated FDSOI STT-MRAM active WL blocks 101, e.g., 101a, 101b, 101c, . . . 101zz, each having a NW are formed across a memory array 103, e.g., a 512 WL×128 BL array, and FDSOI STT-MRAM dummy WL blocks 105, e.g., 105a, 105b, 105c, 105d, . . . 105zz, each having a PW are formed parallel to and on opposite sides of each active WL block 101, respectively. A plurality of laterally separated SL and BL structures (not shown for illustrative convenience) are formed across the memory array, e.g., perpendicular to the active and dummy WL blocks 101 and 105, respectively, and are connected to the active and dummy blocks 101 and 105, respectively. Consequently, FBB may be applied to a selected active WL block 101, e.g., 101b, to improve $I_{write}$ with a smaller cell size relative to known FDSOI STT-MRAM and zero or RBB may be applied to the unselected active WL blocks 101, e.g., 101a, 101b, 101c, . . . 101zz, to minimize unselected cell leakage.

Figure 2:
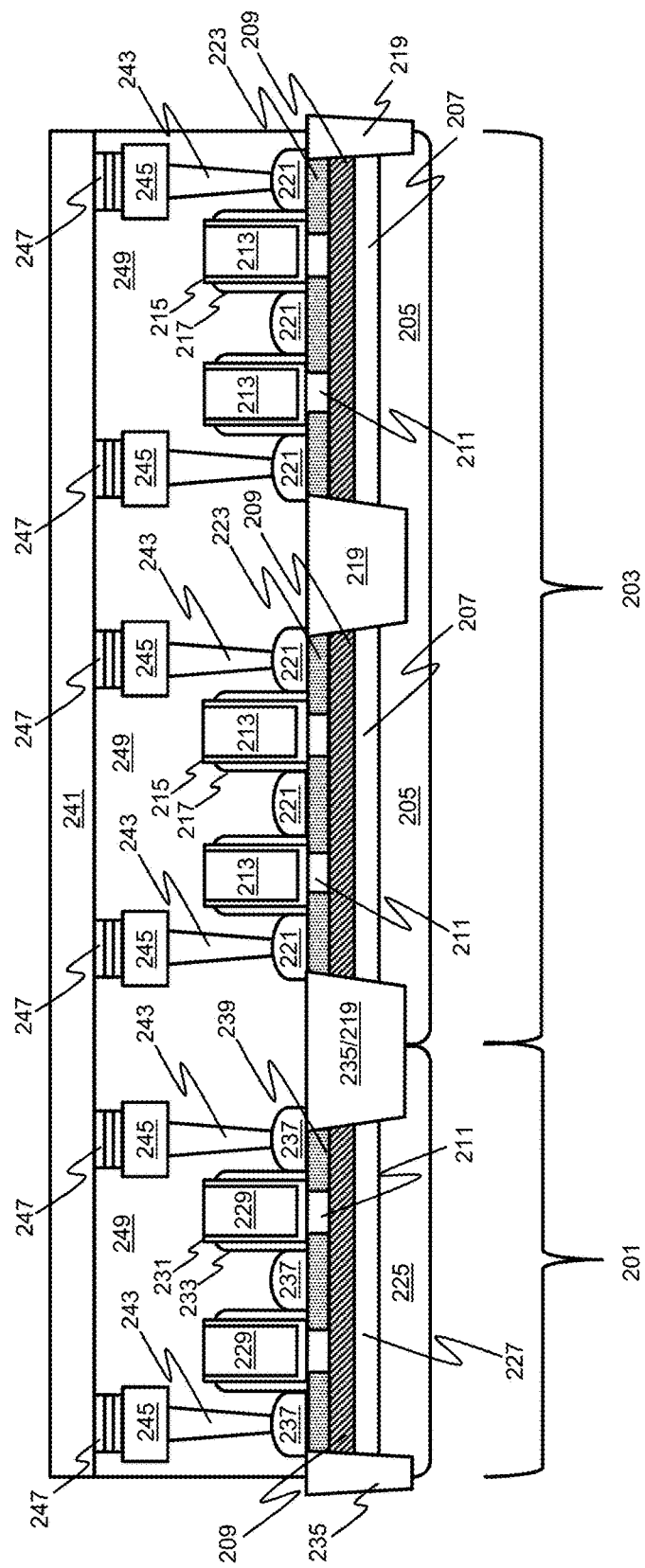
FIG. 2 schematically illustrates a cross-sectional view of a portion of the segmented FDSOI STT-MRAM of FIG. 1, in accordance with an exemplary embodiment.

FIG. 2 schematically illustrates a cross-sectional view of a portion of the segmented FDSOI STT-MRAM of FIG. 1, in accordance with an exemplary embodiment. Adverting to FIG. 2, a FDSOI STT-MRAM dummy WL block 201, e.g., dummy WL block 105a of FIG. 1, is formed adjacent to and parallel to a FDSOI STT-MRAM active WL block 203, e.g., active WL block 101a of FIG. 1, and a second dummy WL block (not shown for illustrative convenience), e.g., dummy WL block 105b of FIG. 1, is formed on the opposite side of the active dummy WL block 203. In this instance, the active and dummy WL blocks 203 and 201, respectively, are formed based on a 1T1MTJ cell structure, but they also could be formed based on a 2T1MTJ, SL/BL, or local SL cell structure.

Each active WL block 203 is formed by conventional processes and includes a NW 205, e.g., a low threshold voltage (LVT) NW; a GP-N layer 207 over the NW 205; a BOX layer 209 over the GP-N layer 207; a Si layer 211 over the BOX layer 209; two pairs of laterally separated gates 213 (each including a liner 215 and spacers 217) over the Si layer 211; a STI region 219 formed through the Si, BOX, and GP-N layers 211, 209, and 207, respectively, and a portion of the NW 205 on opposite sides of each pair of gates 213; and a nRSD 221 over each nLDD 223 adjacent to and on opposite sides of each gate 213. In this instance, each active WL block 203 includes four gates 213 and each gate 213 is utilized as an active WL; however, it is contemplated that each active WL block 203 could include more gates 213 and, therefore, each active WL block 203 could be much larger.

Each dummy WL block 201 is also formed by conventional processes; however, each dummy WL block 201 includes a PW 225, e.g., a high threshold voltage (HVT) or flip-well PW; a GP-P layer 227 over the PW 225; the BOX layer 209 over the GP-P layer 227; the Si layer 211 over the BOX layer 209; laterally separated gates 229 (each including a liner 231 and spacers 233) formed over the Si layer 211; a STI region 235 formed through the Si, BOX, and GP-P layers 211, 209, and 227, respectively, and a portion of the PW 225 on opposite sides of the gates 229; and a nRSD 237 over each nLDD 239 adjacent to and on opposite sides of each gate 229. In this instance, each dummy WL block 201 includes two gates 229 and each gate 229 is utilized as a dummy WL; however, it is contemplated that each dummy WL block 201 could include more gates 229. Moreover, in this instance, each active and dummy WL block 203 and 201, respectively, is formed as an n-type field-effect transistor (NFET); however, it is also contemplated that each active and dummy WL block 203 and 201, respectively, could be formed as a p-type field-effect transistor (PFET) by using the opposite dopants to form the NW 205, GP-N layer 207, nRSD 221, and nLDD 223 and the PW 225, GP-P layer 227, nRSD 237, and nLDD 239.

Figure 3:
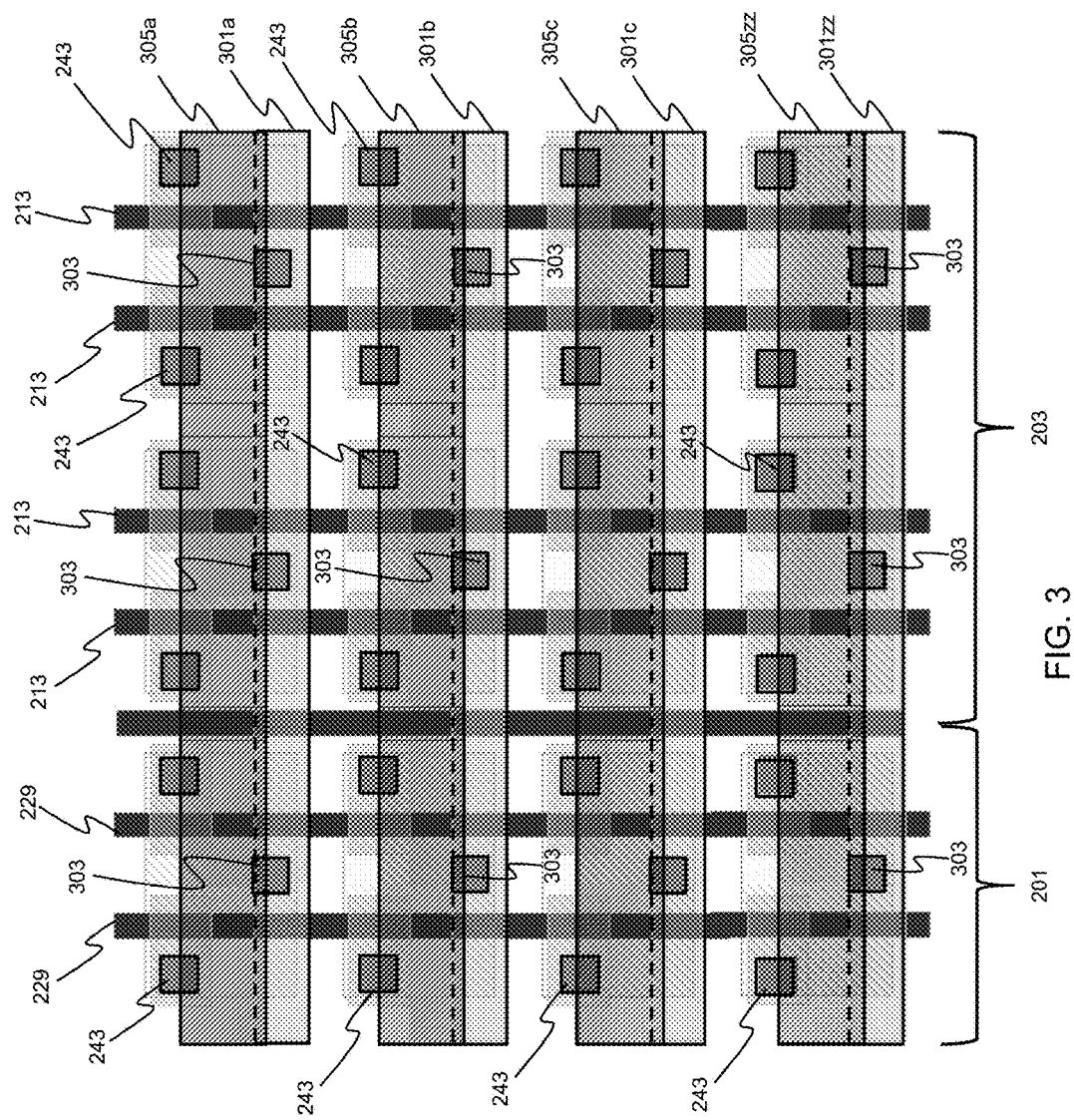
FIG. 3 schematically illustrates a top view of FIG. 2.

In addition, a plurality of laterally separated SL structures (not shown for illustrative convenience), for example, SL structures 301a, 301b, 301c, . . . 301zz of FIG. 3 (a top view of FIG. 2), e.g., representing SL0 through S127 of a standard a 512 WL×128 BL array, are formed across a memory array, e.g., memory array 103 of FIG. 1. In this instance, each SL structure is formed perpendicular to the active and dummy WL blocks 203 and 201, respectively; however, it is also contemplated that the SL structures could be formed parallel to the active and dummy WL blocks 203 and 201, respectively. The SL structures are connected to the active and dummy blocks 203 and 201, respectively, by a SL contract (not shown for illustrative convenience), e.g., SL contact 303 of FIG. 3, connected to the nRSD 221 and nRSD 237 between each pair of active and dummy gates 213 and 229, respectively.

Further, a plurality of BL structures 241, for example, BL structures 305a, 305b, 305c, . . . 305zz of FIG. 3, e.g., representing BL0 through BL127 of a standard 512 WL×128 BL array, are formed across the same memory array, e.g., memory array 103 of FIG. 1. In this instance, the plurality of BL structures 241 are formed parallel to the SL structures; however, it is contemplated, as discussed above, that the SL structures may also be formed perpendicular to the plurality of BL structures 241. Each BL structure 241 is connected to the plurality of active and dummy WL blocks 203 and 201, respectively, by a CT 243 formed over each nRSD 221 and 237 on opposite sides of the active and dummy gates 213 and 229, respectively; a landing pad 245 connected to each CT 243; and a MTJ stack 247 connected to each landing pad 245. The segmented FDSOI STT-MRAM of FIG. 2 also includes an interlayer dielectric 249. In this instance, each MTJ stack 247 is formed between a landing pad 245 and a BL structure 241; however, it is also contemplated that the MTJ stack 247 may be formed in a subsequently formed metal layer, e.g., M2-M6. Also, it is further contemplated that in some instances there will be missing contacts or vias, e.g., SL contact 303, such that the SL structures, e.g., SL structures 301a, 301b, 301c, . . . 301zz of FIG. 3, and the BL structures 241, for example, BL structures 305a, 305b, 305c, . . . 305zz of FIG. 3, are not connected to the gates 229 of the dummy WL blocks 201.

Consequently, the segmented FDSOI STT-MRAM of FIGS. 1 through 3 enables an application of FBB at selected cell blocks to improve $I_{Write}$ with a smaller cell size relative to known FDSOI STT-MRAM such that $I_{Write}=I_{Write}$ (voltage of the body (VBB)=FBB) and enables an application of zero or RBB to the unselected cell blocks for reduced unselected WL leakage in the unselected blocks such that $I_{Leakage}=X \cdot I_{Leakage}$ (VBB=FBB)+$Y \cdot I_{Leakage}$ (VBB+RBB)+$Z \cdot I_{Leakage}$ (VBB=0 volts (V)), wherein Selected Blocks: FBB (#WLs=X); Unselected Blocks: zero BB or slight RBB (#WLs=Y); and Dummy Blocks: zero BB (#Dummy WLs=Z). For example, if there are 16 or 32 active WL blocks, the total leakage with respect to the unselected blocks is VBB=−0.3V, which is comparable or lower than a known bitcell without VBB biasing. Example bias ranges of FIGS. 1 through 3 are depicted in Table A below. It should be noted that the bias properties depicted in Table A are provided for illustration and are not intended as a limitation.

| Blocks | | WL (V) | BL (V) | SL (V) | BB (V) | Other WL/BL/SL (V) |
|---|---|---|---|---|---|---|
| P-AP | Sel. | 1.2-1.8 | 0 | 0.6-1.0 | 1.8 | 0 |
| Write | Unsel. | 0 | 0 | 0.6-1.0 | −0.3 or 0 | 0 |
| AP-P | Sel. | 1.0-1.6 | 0.4-0.8 | 0 | 1.8 | 0 |
| Write | Unsel. | 0 | 0.4-0.8 | 0 | −0.3 or 0 | 0 |
| Read | Sel. | 0.8-1.4 | 0.1-0.2 | 0 | 0 or 1.8 | 0 |
| | Unsel. | 0 | 0.1-0.2 | 0 | −0.3 or 0 | 0 |

The embodiments of the present disclosure can achieve several technical effects including improving/maximizing write margin with FBB and reducing/minimizing unselected cell leakage with reverse or zero BB with a smaller cell size relative to known FDSOI STT-MRAM; alleviating the select transistor VWL bias TDDB concerns and the high unselected cell leakage concerns associated with FBB; as well as being well suited for embedded flash (eFlash) and static random access memory (SRAM) applications wherein VWL is limited by TDDB. Additional technical effects include providing a differential sensing STT-MRAM design with true random access, reduced bit-to-bit variation/mismatch, and improved write/read margins. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with STT-MRAM on FDSOI.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a plurality of fully depleted silicon-on-insulator spin-transfer torque magnetoresistive random-access memory (FDSOI STT-MRAM) active word line (WL) blocks laterally separated across a memory array, each active WL block formed by:
   forming a n-type well (NW);
   forming a n-type ground plane (GP-N) layer over the NW;
   forming a buried oxide (BOX) layer over the GP-N layer;
   forming a silicon (Si) layer over the BOX layer;
   forming two pairs of two gates laterally separated over the Si layer;
   forming a shallow trench isolation (STI) region through the Si, BOX, and GP-N layers and a portion of the NW on opposite sides of each pair of gates;
   forming a n-type lightly dope drain (nLDD) in the Si layer on opposite sides and under a portion of each gate; and
   forming a n-type raised source/drain (nRSD) over each nLDD adjacent to and on opposite sides of each gate;
   forming a FDSOI STT-MRAM dummy WL block parallel to and on opposite sides of each active WL block;
   forming a plurality of source line (SL) structures laterally separated across the memory array;
   forming a plurality of bit line (BL) structures laterally separated across the memory array; and
   connecting the plurality of SL and BL structures to the plurality of active WL blocks.

2. The method according to claim 1, further comprising:
   selecting one active WL block for a write function;
   applying forward body bias (FBB) to the selected active WL block; and
   applying zero or reverse body bias (RBB) to all unselected active WL blocks.

3. The method according to claim 1, comprising forming each dummy WL block by:
   forming a p-type well (PW);
   forming a p-type ground plane (GP-P) layer over the PW;
   forming the BOX layer over the GP-P layer;
   forming the Si layer over the BOX layer;
   forming gates laterally separated over the Si layer;
   forming a STI region through the Si, BOX, and GP-P layers and a portion of the PW on opposite sides of the gates;
   forming a nLDD in the Si layer on opposite sides and under a portion of each gate; and
   forming a nRSD above each nLDD adjacent to and on opposite sides of each gate.

4. The method according to claim 3, comprising utilizing each gate of an active WL block as an active WL and each gate of a dummy WL block as a dummy WL.

5. The method according to claim 3, comprising connecting a SL structure to the plurality of active blocks by:
   forming a SL contact over a nRSD between each pair of gates of each active WL block; and
   connecting the SL structure to the SL contacts.

6. The method according to claim 3, comprising connecting a BL structure to the plurality of active WL blocks by:
   forming a metal/via stack or contact (CT) over each nRSD on opposite sides of each pair of gates of each active WL block;
   forming a landing pad over each CT;
   forming a magnetic tunneling junction (MTJ) stack over each landing pad; and
   connecting the BL structure to the MTJ stacks.

7. The method according to claim 6, comprising connecting a SL and a BL structure to the plurality of dummy WL blocks by:
   forming a SL contact over a nRSD between a pair of gates of each dummy WL block;
   forming a CT over each nRSD on opposite sides of a pair of gates of each dummy WL block;
   connecting the ST structure to the SL contacts; and
   connecting the BL structure to the MTJ stacks.

8. A device comprising:
   a plurality of fully depleted silicon-on-insulator spin-transfer torque magnetoresistive random-access memory (FDSOI STT-MRAM) active word line (WL) blocks laterally separated across a memory array, wherein each active WL block comprises:
   a n-type well (NW);
   a n-type ground plane (GP-N) layer over the NW;
   a buried oxide (BOX) layer over the GP-N layer;
   a silicon (Si) layer over the BOX layer;
   two pairs of two gates laterally separated over the Si layer;
   a shallow trench isolation (STI) region through the Si layer, BOX, and GP-N layers and a portion of the NW on opposite sides of each pair of gates;
   a n-type lightly dope drain (nLDD) in the Si layer on opposite sides and under a portion of each gate; and
   a n-type raised source/drain (nRSD) over each nLDD adjacent to and on opposite sides of each gate;
   a FDSOI STT-MRAM dummy WL block parallel to and on opposite sides of each active WL block;
   a plurality of source line (SL) structures laterally separated across the memory array; and
   a plurality of bit line (BL) structures laterally separated across the memory array,
   wherein each SL and BL structure is connected to the plurality of active WL blocks.

9. The device according to claim 8, wherein one active WL block selected for a write function allows an application of forward body bias (FBB) and all unselected active WL blocks allow an application of zero or reverse body bias (RBB).

10. The device according to claim 8, wherein each dummy WL block comprises:
- a p-type well (PW);
- a p-type ground plane (GP-P) layer over the PW;
- the BOX layer over the GP-P layer;
- the Si layer over the BOX layer;
- a pair of the gates laterally separated over the Si layer;
- the STI region through the Si, BOX, and GP-P layers and a portion of the PW on opposite sides of the gates;
- the nLDD in the Si layer on opposite sides and under a portion of each gate; and
- the nRSD above each nLDD adjacent to and on opposite sides of each gate.

11. The device according to claim 10, wherein each gate of an active WL block is utilized as an active WL and each gate of a dummy WL block is utilized as a dummy WL.

12. The device according to claim 10, wherein the connection between a SL structure and the plurality of active blocks comprises:
- a SL contact over each nRSD between each pair of gates of each active WL block.

13. The device according to claim 10, wherein the connection between a BL structure and the plurality of active blocks comprises:
- a metal/via stack or contact (CT) over each nRSD on opposite sides of each pair of gates of each active WL block;
- a landing pad over each CT; and
- a magnetic tunneling junction (MTJ) stack over each landing pad.

14. The device according to claim 13, wherein the connection between a SL structure and the plurality of dummy WL blocks and the connection between a BL structure and the plurality of dummy WL blocks respectively comprise:
- a SL contact over each nRSD between a pair of gates of each dummy WL block; and
- a CT over each nRSD on opposite sides of a pair of gates of each dummy WL block.

15. The device according to claim 8, wherein the plurality of active and dummy WL blocks comprise a one transistor and one MTJ (1T1MTJ), a two transistors and one MTJ (2T1MTJ), a SL//BL, or a local SL cell structure.

16. A method comprising:
- forming a plurality of fully depleted silicon-on-insulator spin-transfer torque magnetoresistive random-access memory (FDSOI STT-MRAM) active word line (WL) blocks laterally separated across a memory array, each active WL block formed by:
  - forming a n-type well (NW);
  - forming a n-type ground plane (GP-N) layer over the NW;
  - forming a buried oxide (BOX) layer over the GP-N layer;
  - forming a silicon (Si) layer over the BOX layer;
  - forming two pairs of two gates laterally separated over the Si layer;
  - forming a shallow trench isolation (STI) region through the Si layer, BOX, and GP-N layers and a portion of the NW on opposite sides of each pair of gates;
  - forming a n-type lightly dope drain (nLDD) in the Si layer on opposite sides and under a portion of each gate; and
  - forming a n-type raised source/drain (nRSD) over each nLDD adjacent to and on opposite sides of each gate;
- forming a FDSOI STT-MRAM dummy WL block parallel to and on opposite sides of each active WL block;
- forming a plurality of source line (SL) structures laterally separated across the memory array, perpendicular to the active and dummy WL blocks;
- forming a plurality of bit line (BL) structures laterally separated across the memory array, parallel to the plurality of SL structures and perpendicular to the active and dummy WL blocks;
- connecting the plurality of SL and BL structures to the plurality of active and dummy WL blocks;
- selecting one active WL block for a write function;
- applying forward body bias (FBB) to the selected active WL block; and
- applying zero or reverse body bias (RBB) to all unselected active WL blocks.

17. The method according to claim 16, comprising forming each dummy WL block by:
- forming a p-type well (PW);
- forming a p-type ground plane (GP-P) layer over the PW;
- forming the BOX layer over the GP-P layer;
- forming the Si layer over the BOX layer;
- forming a pair of the gates laterally separated over the Si layer;
- forming the STI region through the Si layer, BOX, and GP-P layers and a portion of the PW on opposite sides of the gates;
- forming the nLDD in the Si layer on opposite sides and under a portion of each gate; and
- forming the nRSD above each nLDD adjacent to and on opposite sides of each gate.

* * * * *